US005802185A

United States Patent [19]

Hansen

[11] Patent Number: 5,802,185

[45] Date of Patent: Sep. 1, 1998

[54] SLIDE CONTROL SYSTEM

[76] Inventor: Albert Frederick Hansen, 156 Lower Dent Street, Whangarei, New Zealand

[21] Appl. No.: 504,239

[22] Filed: Jul. 19, 1995

[30] Foreign Application Priority Data

Jul. 19, 1994 [NZ] New Zealand ............................ 264046

[51] Int. Cl.$^6$ ...................................................... H03G 5/00

[52] U.S. Cl. .............................. 381/98; 381/109; 381/119

[58] Field of Search .............................. 381/98, 109, 119

[56] References Cited

U.S. PATENT DOCUMENTS 3,585,560 6/1971 Schlesier ................................ 338/131

4,612,665 9/1986 Inami et al. .............................. 381/98

*Primary Examiner*—Curtis Kuntz

*Assistant Examiner*—Duc Nguyen

*Attorney, Agent, or Firm*—Clifford W. Browning; Woodard, Emhardt, Naughton, Moriarty & McNett

[57] ABSTRACT

A slide control system suitable for a graphic equaliser comprises a number of slide controls grouped into sets of at least two and typically three slide controls. Bridge means including a knob or gripping portion is mounted in one of the slide controls and extends across to releasably engage the adjacent slide control(s) so that all the slide controls of the set normally are coupled for movement together in a single operation, but temporary release of the bridge means from the adjacent slide control(s) enables separate movement of each of the slide controls of the set relative to one another.

9 Claims, 2 Drawing Sheets

SLIDE CONTROL SYSTEM

FIELD OF INVENTION

The present invention comprises a slide control system suitable for use on a graphic equaliser, for example.

BACKGROUND OF INVENTION

The purpose of a graphic equaliser in a high fidelity sound system is to enable adjustment of the frequency response of the sound system to match that of the room or auditorium in which the sound system is used. Typically the front face of a graphic equaliser comprises a series of adjacent slide controls, each of which controls the system gain at a particular frequency. The gain at that frequency is increased or decreased by sliding the particular control for that frequency up or down. Each slide control is moved individually to adjust the response at each individual frequency.

Similar adjacent slide controls are used for adjusting related characteristics in other systems including non-audio systems for example.

SUMMARY OF INVENTION

The present invention provides an improved or at least alternative slide control system.

In broad terms the invention comprises a slide control system comprising at least one slide control set comprising at least two manually operable slide controls each controlling related characteristics, bridge means mounted in one of the slide controls and extending across to releasably engage the adjacent slide control(s) so that all the slide controls of the set normally are coupled for movement together in a single operation, but temporary release of the bridge means from the adjacent slide control(s) enables separate movement of each of the slide controls of the set relative to one another, Preferably the slide controls are adjacent slide controls of a graphic equaliser and the characteristic controlled by each slide control is the gain at a different frequency of the graphic equaliser.

Preferably the slide control system comprises multiple slide control sets, and each slide control set comprises three slide controls coupled together, and the bridge means is mounted in the middle slide control.

Preferably the bridge means coupling the adjacent slide controls of the set also comprises an integral knob or gripping portion for movement of the slide control set.

DESCRIPTION OF DRAWINGS

A preferred form slide control system of the invention applied to a graphic equaliser, is shown in the accompanying drawings, by way of example and without intending to be limiting. In the drawings.

DESCRIPTION OF PREFERRED FORM

Figure 1:
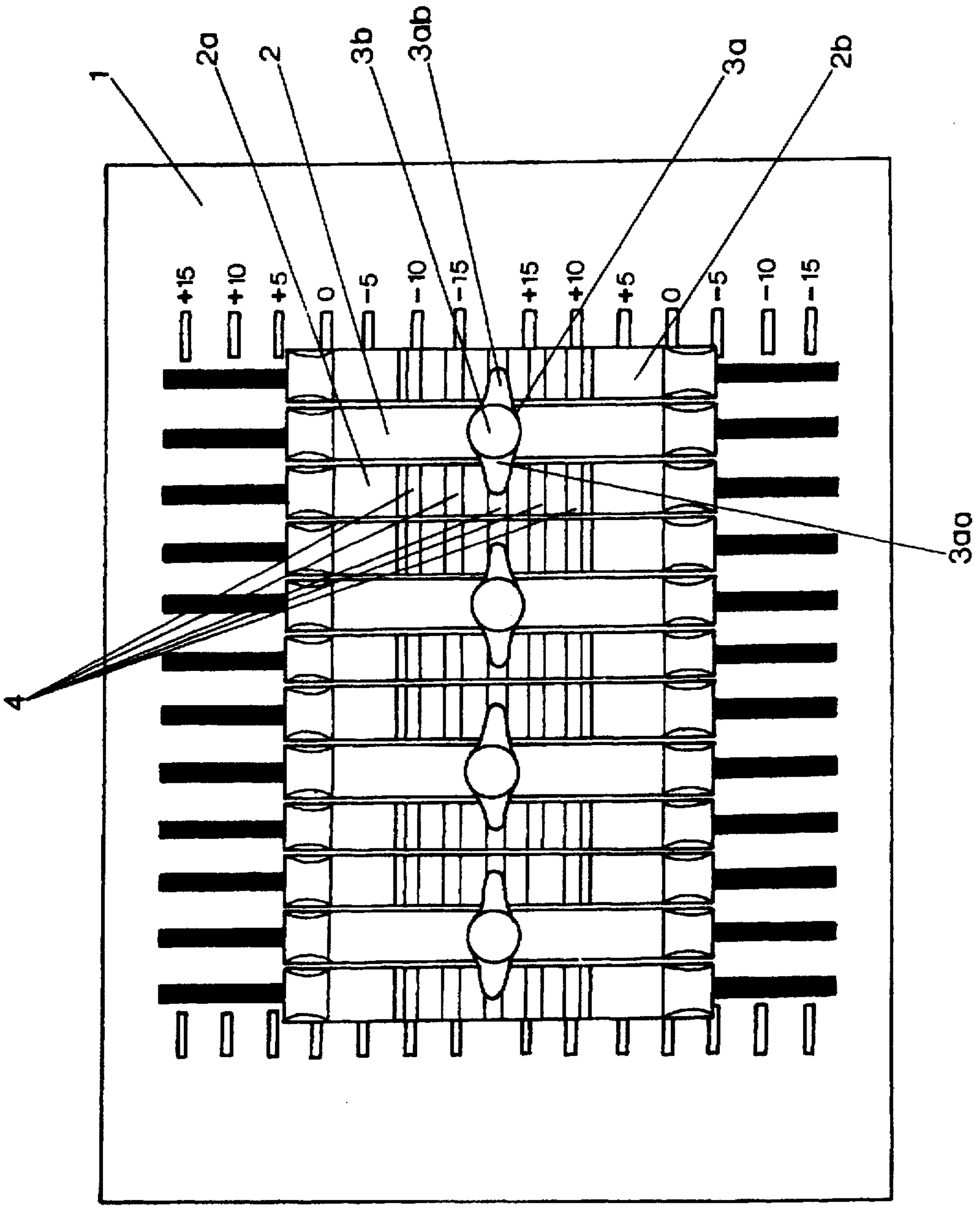
FIG. 1 shows the front face of a graphic equaliser, the frequency adjustment slide controls of which are coupled together in sets according to the invention.

Referring to the drawings, the front face of the graphic equaliser is indicated at 1. On the front face 1 are conveniently provided a series of adjacent slide controls each of which adjusts the gain at a particular frequency In the preferred form shown in the drawings each three adjacent slide controls arm coupled together by way of a bridge piece 3*a* incorporating an integral knob 3*b*, to form a set of coupled slide controls.

Figure 2:
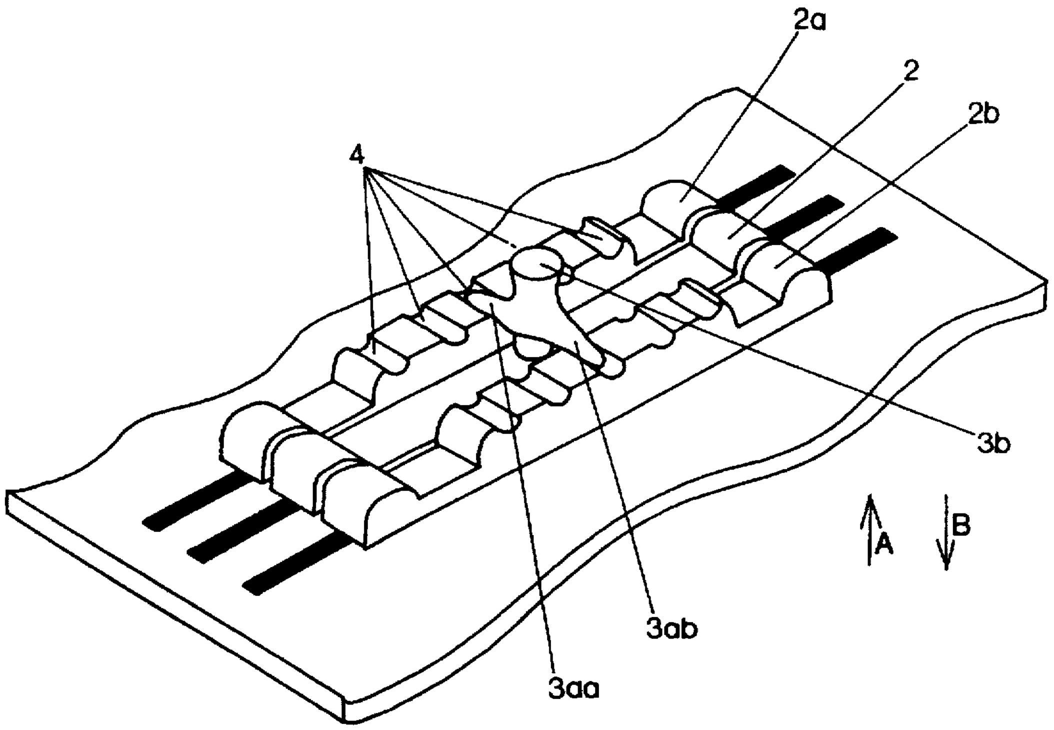
FIG. 2 shows one individual set of three slide controls of the graphic equaliser of FIG. 1.
Figure 3:
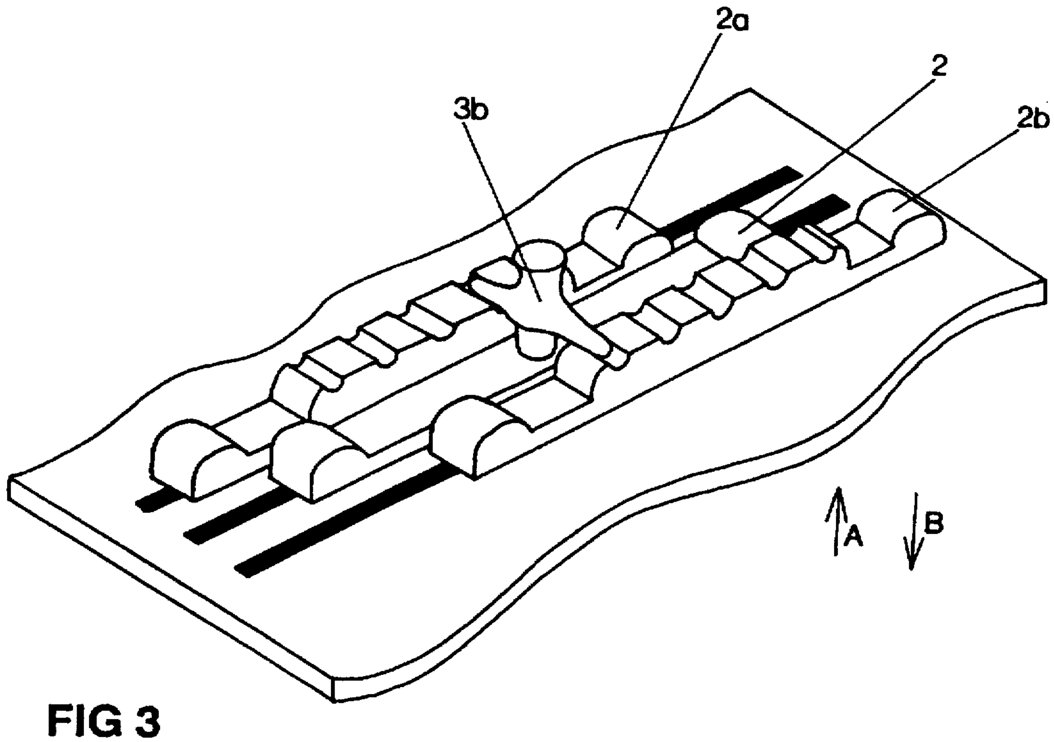
FIG. 3 shows the slide controls set of FIG. 2 with some of the individual slide controls of the set repositioned relative to one another.

FIGS. 2 and 3 show an individual set of three coupled slide controls. The centre slide control is indicated at 2 and the slide controls on either side are indicated 2*a* and 2*b*. The bridge piece 3*a*/knob 3*b* component is mounted to the centre slide control 2 and is mounted so that it can be lifted slightly in the direction of arrow A in FIGS. 2 and 3, but is spring loaded in the direction of arrow B so that the arms 3*aa* and 3*ab* of the bridge will normally engage the grooves or notches 4 of the slide controls 2*a* and 2*b* as shown so that all three slide controls of the set are coupled together.

The arrangement is such that pushing the knob 3*b* moves all tree slide controls 2*a*, 2 and 2*b* simultaneously, so that each does not need to be moved separately i.e. the three can normally be adjusted together. In the case of a graphic equaliser providing for adjustment at 30 specific points across an audio frequency band for example, 10 sets each of three slide controls ganged together as shown would be provided. Each of the slide controls in any set can be adjusted independently of the other by lifting the bridge part 3*b* via the knob 3*a*, so that the bridge part 3*a* is lifted from engagement with the grooves 4 on the slide controls 2*a* and 2*b* on either side, which then enables all of the slide controls of the set to be adjusted relative to one another. The knob 3*b* is then released so that the bridge part 3*a* will re-engage the appropriate notches in the top of the slide controls 2*a* and 2*b*.

Each notch 4 or similar may provide for ±2.5 dB gain adjustment for example. For example, three adjacent slide controls may control the gain at 10250 Hz, 11000 Hz, and 11750 Hz. If the same gain is desired at all of these three frequencies, then the slide controls 2*a*, 2 and 2*b* would all be similarly positioned relative to one another as shown in FIG. 2. The gain across this three frequency band could be increased or decreased by moving all three slide controls together via the knob 3*b*. Alternatively, if it is desired to, for example, increase the gain at 11750 Hz and decrease the gain at 10250 H, then the knob 3*b*/bridge part 3*a* is lifted and the slide control 2*b* shifted up one notch relative to the centre slide control 2 and the slide control 2*a* shifted down one notch relative to the centre slide control 2. The knob 3*b*/bridge part 3*a* is then released so that the bridge part 3*b* engages the appropriate notches 4 on the slide controls 2*a* and 2*b*. Once this relative adjustment has been made, again the overall gain across the three frequency bands can then be adjusted relative to other three frequency bands controlled by similar three slide sets by pushing the knob 3*a* to move all three slide controls together.

The number of notches 4 provided on each of the slide controls 2*a* and 2*b* will be dependant upon the amount of gain variation possible with any graphic equaliser, and the gain to be represented by each notch. Typically five notches 4 on each slide control may be provided. Also, instead of the bridge parts 3*b* engaging in the notches 4 on the adjacent slide controls, alternatively the bridge part could comprise short pins which enter into small holes on the top of each slide control 2*a* and 2*b* for example. It is also not essential that the knob 3*a* or equivalent be provided on the centre slide control.

In the preferred form shown in the drawings, each set comprises three slide controls coupled together but it is possible that each set could comprise two slide controls, or alternatively four or five or more slide controls coupled together as described as defined in the following claims.

The preferred form of the invention shown in the drawings is shown applied to the slide controls of an audio graphic equaliser, but the slide control system of the invention can be applied to other systems or units where related characteristics are adjusted together.

The foregoing describes the invention including a preferred form thereof. Alterations and modifications as will be obvious to those skilled in the art are intended to be incorporated within the scope hereof.

I claim:

1. A slide control system comprising at least one slide control set comprising at least two manually operable parallel slide controls each controlling related characteristics, bridge means mounted on a first slide control and extending transversely to releasably engage one or more adjacent slide control/controls to couple all the slide controls of the set for movement together in a single operation, and means to enable said bridge means to be temporarily lifted out of engagement with said adjacent slide control/controls to allow separate movement of said slide control relative to one another wherein each adjacent slide control includes spaced apart grooves or notches along the length of each slide control, and wherein an arm portion of the bridge means engages one of said grooves or notches on each adjacent slide control.

2. A slide control system according to claim 1, wherein the slide control system comprises two or more of said slide control sets with all of the slide controls of all of the sets controlling related characteristics.

3. A slide control system according to claim 1, wherein each slide control set comprises three or more slide controls coupled together.

4. A slide control system according to claim 2, wherein each slide control set comprises three or more slide controls coupled together.

5. A slide control system according to claim 3, wherein each slide control set comprises three parallel slide controls and said first slide control mounting said bridge means is the center slide control.

6. A slide control system according to claim 2, wherein the bridge means comprises an integral gripping portion by which the slide control set may be moved.

7. A slide control system as claimed in claim 6, wherein the bridge means is spring biased towards the slide controls.

8. A slide control system according to claim 1, wherein the slide controls are adjacent slide controls of a graphic equaliser and the characteristic controlled by each slide control is the gain at a different frequency of the graphic equaliser.

9. A slide control system according to claim 6, wherein the slide controls are adjacent slide controls of a graphic equaliser and the characteristic controlled by each slide control is the gain at a different frequency of the graphic equalizer.

* * * * *

UNITED STATES PATENT AND TRADEMARK OFFICE

CERTIFICATE OF CORRECTION

PATENT NO. : 5,802,185

DATED : September 1, 1998

INVENTOR(S) : Albert Frederick Hansen

It is certified that error appears in the above-identified patent and that said Letters Patent is hereby corrected as shown below:

In column 2, line 4, please change the word "arm" to –are--

In column 2, line 18, please change the word "tree" to –three--

In column 2, line 42, please change "10250 H," to –10250Hz,--

In column 3, line 23, please insert a comma after the word "another"

In column 4, line 14, please insert the words –knob or—after the word "integral"

In column 4, line 27, please change the word "equalizer" to –equaliser--

Signed and Sealed this

Eighth Day of December, 1998

Attest:

BRUCE LEHMAN

*Attesting Officer*

*Commissioner of Patents and Trademarks*